United States Patent
Lee

[11] Patent Number: 5,903,493
[45] Date of Patent: May 11, 1999

[54] METAL TO METAL CAPACITOR APPARATUS AND METHOD FOR MAKING

[75] Inventor: Kuo-Hua Lee, Orlando, Fla.

[73] Assignee: Lucent Technologies Inc., Murray Hill, N.J.

[21] Appl. No.: 08/932,005

[22] Filed: Sep. 17, 1997

[51] Int. Cl.⁶ .................................................. G11C 11/24
[52] U.S. Cl. ........................... 365/149; 365/63; 257/296; 257/906
[58] Field of Search ............................. 365/149; 257/906, 257/908, 296

[56] References Cited

U.S. PATENT DOCUMENTS

| | | | |
|---|---|---|---|
| 5,341,324 | 8/1994 | Matsumoto et al. | 365/51 |
| 5,381,365 | 1/1995 | Ajika et al. | 365/149 |
| 5,383,152 | 1/1995 | Miyake | 365/149 |
| 5,504,704 | 4/1996 | Sato et al. | 365/182 |
| 5,519,237 | 5/1996 | Itoh et al. | 365/149 |
| 5,604,696 | 2/1997 | Takaishi | 365/149 |
| 5,661,319 | 8/1997 | Fuji et al. | 365/149 |
| 5,699,291 | 12/1997 | Tsunemine | 365/149 |
| 5,701,264 | 12/1997 | Shrivastava et al. | 365/149 |
| 5,712,813 | 1/1998 | Zhang | 365/149 |

*Primary Examiner*—David Nelms
*Assistant Examiner*—Tuan T. Nguyen
*Attorney, Agent, or Firm*—John M. Harman

[57] ABSTRACT

Embodiments of the invention include a dynamic random access memory (DRAM) and method for making a DRAM in which the capacitive elements are fabricated to be planar or nearly planar and to be located above the metal regions (M1) that connect the sources and drains of the transistor through conductive windows (W1). Embodiments of the invention fabricate the DRAM by forming a transistor on a suitable substrate in the appropriate manner and depositing a first oxide layer that is subsequently planarized by suitable technique. A window is then formed within the oxide layer and a conductive plug is formed within the window. A first patterned metal region, which functions as a memory cell bit line or as a coupler between conductive plugs, is then formed on the oxide layer. A second oxide layer is formed thereon and appropriate windows and conductive plugs are formed therein. Then, a capacitor is formed thereon in a planar or near planar configuration. A second patterned metal region is formed on the capacitor. A third oxide layer is formed thereon and appropriate windows and conductive plugs are formed therein. A third patterned metal region is then formed on the oxide layer. Finally, a fourth oxide layer is deposited and planarized in an appropriate manner. Alternatively, a trench is formed within the second oxide layer around the conductive plug prior to formation of the capacitor thereon. Also, in alternative embodiments, conductive plugs are coupled without the use of patterned metal regions. According to embodiments of the invention, the DRAM fabrication method and the DRAM formed thereby are more conducive than conventional fabrication methods to the use of planarization techniques such as chemical mechanical polishing (CMP). The planar or near planar configuration of the various oxide layers and various DRAM elements formed therein lend themselves well to planarization techniques.

14 Claims, 5 Drawing Sheets

METAL TO METAL CAPACITOR APPARATUS AND METHOD FOR MAKING

BACKGROUND OF THE INVENTION

1. Field of the Invention

The invention relates to the manufacture of electronic devices. More particularly, the invention relates to the fabrication of capacitors within a dynamic random access memory (DRAM) device.

2. Description of the Related Art

Capacitors are used in electronic devices such as integrated circuits (ICs) for storing electrical charge. In ICs such as dynamic random access memory (DRAM), capacitors are used for storage in the memory cells.

Typically, capacitors formed in ICs include a bottom electrode (storage node) made of, e.g., polycrystalline silicon (polysilicon) or hemispherical grain polysilicon (HSG), a dielectric layer made of, e.g., tantalum pentoxide ($Ta_2O_5$) and barium strontium titantate ($BaSrTiO_3$ or BST), and an upper electrode (cell plate) made of, e.g., titanium nitride (TiN), titanium (Ti), tungsten (W), platinum (Pt), polysilicon or other semiconductor conducting materials.

In any fabrication process, simplicity and efficiency is an advantage. A fabrication process that achieves the same or better quality product or higher yield with the same cost of materials while using fewer steps is advantageous, especially if elimination of fabrication steps reduces labor costs and the need for expensive manufacturing equipment. Also, a fabrication process that achieves a better quality product or higher yield but at a slightly higher cost and/or increased number of fabrication steps may nonetheless be advantageous in terms of overall process efficiency.

IC capacitor fabrication processes are exist. For example, Radosevich et al., in U.S. Pat. No. 5,576,240, discloses a method for fabricating a metal-to-metal (MOM) capacitor. The method improves processing flexibility and the quality of the produced product while proposing to reduce or maintain the existing costs of conventional processes. Also, Patterson et al., in U.S. Pat. No. 5,065,220, discloses a metal-to-polysilicon capacitor and its method for making in which the dielectric layer is deposited via low-pressure chemical vapor deposition (LPCVD).

However, the dielectric layer of capacitors formed in ICs typically is a high K dielectric material that does not respond well to conventional etching techniques. Therefore, it would be advantageous for fabrication processes to facilitate the use of processes other than etching, such as chemical-mechanical polishing (CMP) and other planarization techniques, particularly with respect to the formation of the dielectric layer of the capacitor. CMP also is advantageous in that it contributes to the maintenance of the planarization across the semiconductor topography. Also, conventional IC capacitor fabrication processes typically require changing process parameters of transistors and other electronic elements during the manufacture of the semiconductor body.

Therefore, it would be advantageous to have an IC capacitor fabrication process that is more compatible with the existing fabrication processes of other IC devices within the semiconductor device.

SUMMARY OF THE INVENTION

The invention is embodied in a dynamic random access memory (DRAM) and method for making a DRAM in which the capacitive elements are fabricated to be planar or nearly planar and to be located above the metal regions (M1) that connect the sources and drains of the transistor through conductive windows (W1). Embodiments of the invention fabricate the DRAM by forming a transistor on a suitable substrate in the appropriate manner and depositing a first oxide layer that is subsequently planarized by suitable technique. A window is then formed within the oxide layer and a conductive plug is formed within the window. A first patterned metal region, which functions as a memory cell bit line or as a coupler between conductive plugs, is then formed on the oxide layer. A second oxide layer is formed thereon and appropriate windows and conductive plugs are formed therein. Then, a capacitor is formed thereon in a planar or near planar conFIGuration. A second patterned metal region is formed on the capacitor. A third oxide layer is formed thereon and appropriate windows and conductive plugs are formed therein. A third patterned metal region is then formed on the oxide layer. Finally, a fourth oxide layer is deposited and planarized in an appropriate manner. Alternatively, a trench is formed within the second oxide layer around the conductive plug prior to formation of the capacitor thereon. Also, in alternative embodiments, conductive plugs are coupled without the use of patterned metal regions. According to embodiments of the invention, the DRAM fabrication method and the DRAM formed thereby are more conducive than conventional fabrication methods to the use of planarization techniques such as chemical mechanical polishing (CMP). The planar or near planar conFIGuration of the various oxide layers and various DRAM elements formed therein lend themselves well to planarization techniques.

DETAILED DESCRIPTION

Figure 1:
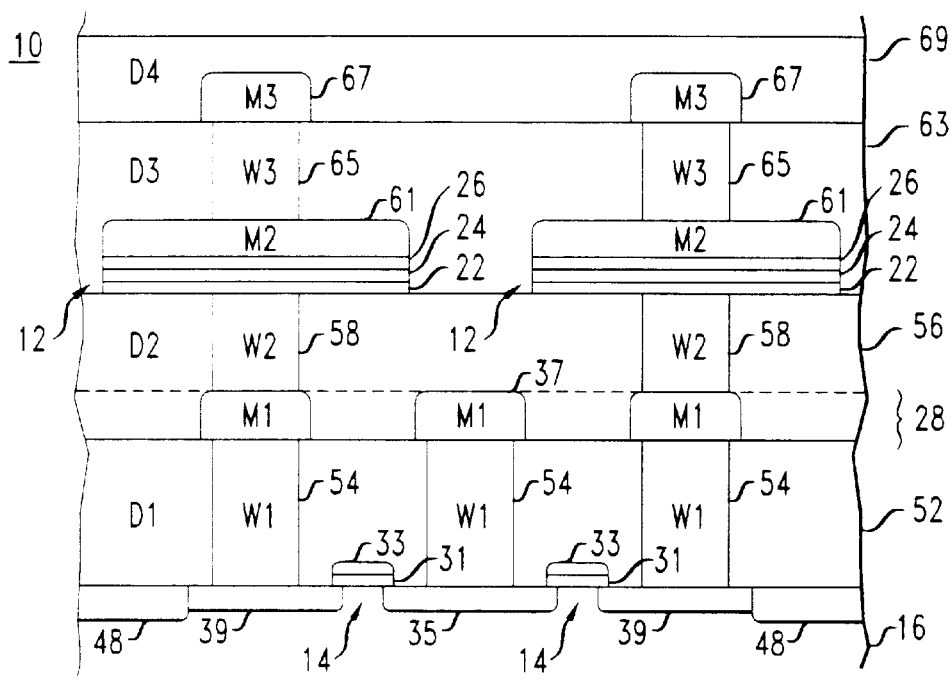
FIG. 1 is a cross-sectional view of a metal-to-metal (MOM) capacitor for an embedded dynamic random access memory (DRAM) cell according to an embodiment of the invention.

In the following description similar components are referred to by the same reference numeral in order to simplify the sequential aspect of the drawings and to enhance the understanding of the invention through the description of the drawings.

Although specific features, configurations and arrangements are discussed hereinbelow, it should be understood that such is done for illustrative purposes only. A person skilled in the relevant art will recognize that other steps, configurations and arrangements can be used without departing from the spirit and scope of the invention.

Referring to FIG. 1, a cross-sectional diagram of metal-to-metal (MOM) capacitors 12 according to an embodiment of the invention is shown. Capacitors 12 are formed within a semiconductor body, e.g., an embedded dynamic random access memory (DRAM) 10. Along with capacitors 12, DRAM 10 includes other electronic device elements, such as N-channel transistors 14.

Capacitor 12 includes a lower plate, electrode or layer 22, an upper plate, electrode or layer 26 and a dielectric layer 24 disposed between upper plate 26 and lower plate 22. According to embodiments of the invention, capacitors 12 are formed after or above a first metal layer or region, conventionally known as metal 1 or M1. Also, capacitors 12, along with other elements within DRAM 10 such as transistor 14 and M1 regions, are formed in planar or near planar configurations that are conducive to the planarization efforts of current IC manufacturing. Planarization of the wafer is important for a consistent wafer topography, which in turn allows accurate pattern imaging.

Figure 2:
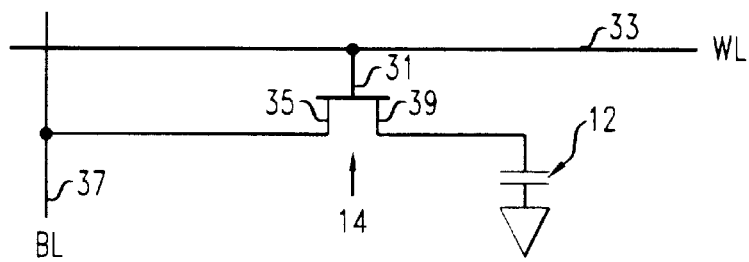
FIG. 2 is a simplified, schematic diagram of a DRAM cell according to a conventional arrangement.
Figure 3:
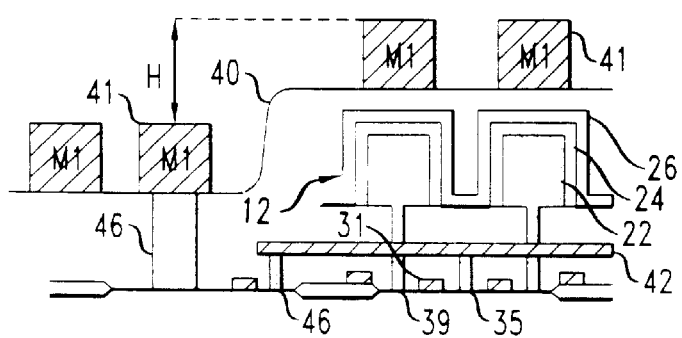
FIG. 3 is a cross-sectional view of a capacitor for a DRAM cell according to a conventional stack cell arrangement.

In a conventional DRAM, e.g., as shown in FIGS. 2–3, the memory cell portion thereof typically includes an access transistor (i.e., transistor 14) with a gate 31 coupled to a data word line 33 (e.g., via the gate contact), a drain 35 coupled to a data bit line 37, and a source 39 connected to one electrode of a storage capacitor 12 whose other electrode is coupled to ground. Transistor 14 serves as a switch to access capacitor 12 either to charge capacitor 12 when information is being stored in the memory cell or to determine if capacitor 12 has been charged as information is being read from the memory cell. High capacitance of capacitor 12 is desired to prevent loss of stored information.

However, as shown particularly in FIG. 3, in conventional DRAMs, capacitor 12 is configured in a stack cell arrangement whereby capacitor 12 is formed within a semiconductor body 40 prior to formation of the M1 regions (shown generally as 41), which typically is used to contact the transistors. This conventional arrangement is problematic in terms of spacing (shown generally as H) when attempting to increase capacitance and to electrically couple source 46 (and the bit line) to external circuitry via the M1 regions. Furthermore, the uneven spacing caused by capacitor 12 does not encourage processes such as CMP. Accordingly, the resulting device has relatively poor planarization.

For example, the bit line exists as a first conducting layer portion 42 disposed below capacitor 12 and the M1 region 41 electrically connected to first portion 42 via one or more electrically conductive plug regions 46. First conducting layer portion 42 typically is made of, e.g., tungsten (W), tungsten silicide (WSi$_2$) or a doped polysilicon. M1 region 41 generally is disposed above capacitor 12 or otherwise is disposed in a manner that is not necessarily planar to first conducting layer portion 42. That is, first conducting layer portion 42 and M1 region 41 typically have to be fabricated using separate formation steps because of their disjunctive locations within DRAM.

Referring again to FIG. 1, DRAMs 10 according to embodiments of the invention include, e.g., a silicon substrate 16 having a transistor 14 with a gate 31, a drain 35, a source 39 and other regions 48 such as field oxides formed therein. In this embodiment, gate 31 is coupled to drain 35 and source 39 as shown, and a word line 33 is coupled to gate 31.

A planarized oxide region or layer 52 (D1) is provided on substrate 16, as shown. Planarized oxide layer D1 has one or more windows 54 (W1) formed therein and filled with any suitable, electrically conductive material such as titanium (Ti), titanium nitride (TiN), tungsten (W) or aluminum (Al), thereby resulting in conductive plugs. The conductive plugs provide electrical coupling through oxide layer D1 between elements in substrate 16 and elements formed on or above oxide layer D1 (e.g., metal 1 elements, discussed hereinbelow).

One or more metal 1 (M1) regions exist on planarized oxide layer D1. The M1 regions result, e.g., from the patterned formation of an initially deposited Metal 1 layer (shown generally as 28).

Another planarized oxide region or layer 56 (D2) exists above oxide layer D1 and patterned M1 regions. Planarized oxide layer D2 has one or more window/plug regions 58 (W2) formed therein, as shown. As discussed previously herein, patterned M1 regions are used, e.g., as bit line 37 or for electrical coupling, e.g., between conductive plugs in windows W1 and W2 to provide electrical coupling through oxide layers D1 and D2, respectively.

Capacitors 12 exist on oxide layer D2 in the form of lower plate or layer 22, a dielectric region or layer 24 and an upper plate or layer 26. One or more metal 2 regions 61 (M2) exist on capacitors 12, as shown. In DRAM 10, the patterned M2 regions are used, e.g., as the top electrodes of capacitors 12.

Yet another planarized oxide region or layer 63 (D3) exists above oxide layer D2, capacitors 12 and M2 regions. Similar to oxide layers D1 and D2, oxide layer D3 has one or more window/plug regions 65 (W3) formed therein, e.g., for coupling to a metal 3 region 67 (M3), which is patterned on oxide layer D3 and plugged window W3. M3 region 67 is used for electrical connection to additional circuitry, e.g., a source voltage or ground, either directly or via one or more conducting layers.

A final, planarized oxide region or layer D4 69 exists on oxide layer D3 and patterned M3 region 67. For purposes of discussion herein, oxide layer D4 is the uppermost oxide layer in DRAM 10. Oxide layer D4 has an upper or outer surface 70, which also serves, e.g., as the upper or outer surface of DRAM 10.

As shown in FIG. 1, capacitors 12 are dimensioned and configured in a manner consistent with planarization techniques. Furthermore, the layering and formation of oxide layers D1–D4 throughout DRAM 10 and the use of conductive plugs in windows W1 and W2 to allow bit lines to be fabricated at the M1 region level (i.e., between transistors 14 and capacitors 12) are used to establish and maintain planarity within DRAM 10. Such arrangement eliminates the need to couple the M1 region to a separate bit line (e.g., as shown in the conventional DRAM cell of FIG. 2).

Figure 4A:
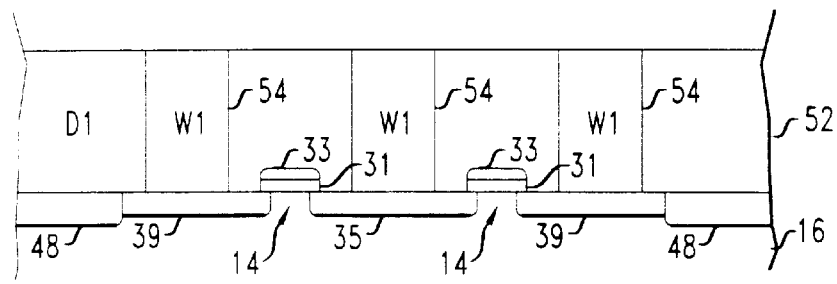
FIGS. 4a–4e are cross-sectional views illustrating various steps in the process according to embodiments of the invention for fabricating the capacitor of FIG. 1.

FIGS. 4a–4e depict various steps of a method for fabricating DRAM 10 according to an embodiment of the invention. Initially, as shown in FIG. 4a, transistor 14 is formed on substrate 16, e.g., in a conventional manner, such as by patterned etching or other suitable photolithographic and doping techniques. Transistor 14 includes a source 39, a drain 35 and a gate 31, as shown. A data word line 33 is coupled to gate 31, e.g., in a conventional manner. Also, a first level oxide layer D1 is formed on substrate 16 and transistor 14, e.g., in a conventional manner, such as by the LOCal Oxidation of Silicon (LOCOS). Oxide layer D1 serves, inter alia, as a dielectric region for isolation between the components formed on substrate 16 and subsequently formed components. Also, other regions such as field oxide regions 48 are formed on or within substrate 16 to separate the doped drain and source regions of transistor 14 from the doped regions of other circuit elements (not shown).

Oxide layer D1 is planarized using a suitable technique, e.g., a chemical-mechanical polishing (CMP) technique. Planarized oxide layer D1 is then patterned and windows (shown generally as W1) are formed therein according to the pattern, e.g., by etching or other suitable technique. Windows W1 are then filled with one or more electrically conductive materials such as titanium (Ti), titanium nitride (TiN), tungsten (W), aluminum (Al) or other suitable material. Planarization of oxide layer D1 and conductive plugs within window W1 is achieved, e.g., by CMP or other suitable planarization techniques.

Figure 4B:
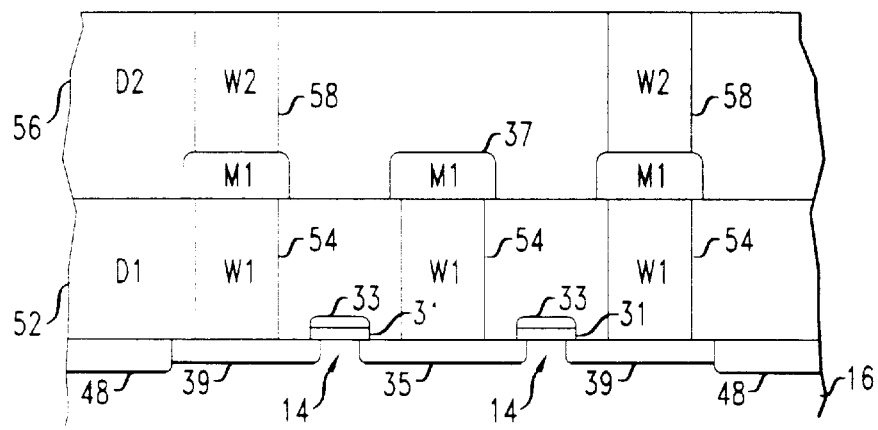

Now referring to FIG. 4b, a first metal layer is formed on oxide layer D1 and then patterned, e.g., in a conventional manner such as by plasma chlorine. As mentioned hereinabove and as will be apparent from subsequent discussions hereinbelow, the patterned regions from the first metal layer (shown generally as M1) are used, e.g., as bit-lines and for electrically coupling various layers of DRAM 10.

Once patterned regions M1 are formed, a second level oxide layer D2 is formed on planarized oxide layer D1 and patterned metal regions M1, as shown. Second oxide layer D2 is planarized (e.g., using CMP) and via windows W2 are selectively formed therein as shown. Such formation is similar to the formation of via windows W1 in first oxide layer D1, discussed hereinabove. Windows W2 are then filled with a conductive material (e.g., titanium, titanium nitride, tungsten or aluminum) and polished (e.g., using CMP) to form conductive plugs whose top surface is planar or nearly planar with second oxide layer D2. In this manner, as mentioned previously herein, certain patterned regions of the first metal layer, e.g., those in electrical connection with the drain 35 of transistor 14, are used for electronic coupling between layers D1 and D2 of DRAM 10. Other patterned regions, e.g., those in electrical connection with the source 39 of transistor 14, are used as bit lines.

Figure 4C:
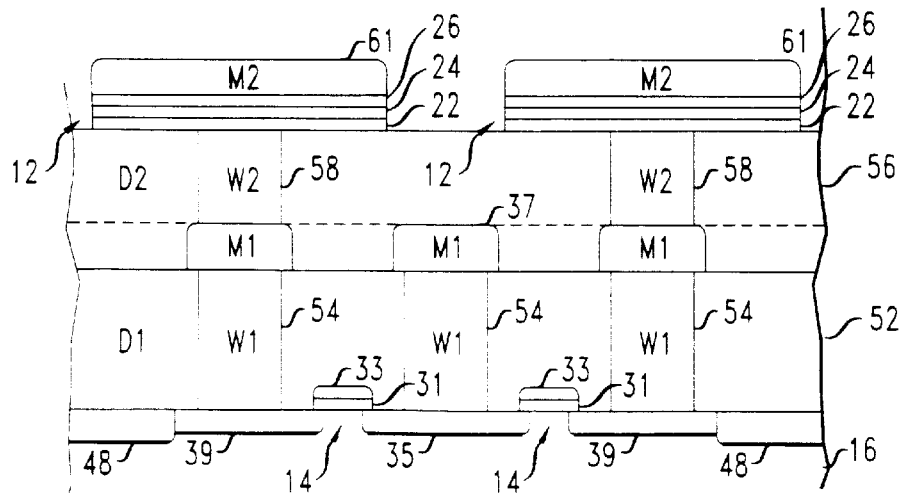

Referring now to FIG. 4c, DRAM 10 is shown after the formation of capacitors 12. Initially, lower plate 22 is formed by depositing a layer of an electrically conductive material on second oxide layer D2 and selectively patterning the layer by an appropriate patterning technique such as reactive sputter etching (RSE). Lower plate 22 is capable of being made from any material suitable for conducting and holding an electric charge, such as titanium nitride (TiN), aluminum (Al), copper (Cu), silver (Ag), titanium (Ti), or noble metals such as gold (Au), platinum (Pt), and/or palladium (Pd). Suitable methods for depositing the layer to be patterned include, e.g., sputtering, chemical vapor deposition (CVD), and plasma enhanced chemical vapor deposition (PECVD). The thickness of lower plate 22 is, e.g., within a range from approximately 100 angstroms (Å) to approximately 1000 angstroms (Å). It is possible for lower plate 22 to have a multi-layered arrangement, e.g., a layer of titanium coated with a layer of titanium nitride.

The formation of dielectric layer 24 on lower plate 22 follows, e.g., by depositing a layer of dielectric material and patterning the layer by appropriate technique. Dielectric layer 24 is formed from any suitable dielectric, e.g., silicon dioxide ($SiO_2$), silicon nitride (SiN) and/or any material or alloy of materials having a suitably large dielectric constant K. Other suitable materials include, e.g., tantalum pentoxide ($Ta_2O_5$), barium strontium titantate ($BaSrTiO_3$ or BST), barium titantate ($BaTiO_3$) and strontium titantate ($SrTiO_3$). The thickness of dielectric layer 24, once formed, typically ranges from approximately 50 angstroms (Å) to approximately 200 angstroms (Å).

Dielectric layer 24 is deposited on lower plate 22 by any suitable technique. For example, if a planar cell (e.g., as shown in FIG. 1) is being employed, dielectric layer 24 typically is deposited by sputtering. However, when trench cell arrangements are employed (e.g., FIGS. 5a–b, discussed hereinbelow), dielectric layer 24 typically is deposited using CVD.

After the formation of dielectric layer 24, upper plate 26 of capacitor 12 is formed by deposition of a layer of suitable material and selective patterning of the deposited layer. Upper plate 26 is made from any material suitable for fabricating capacitors within integrated circuits. As mentioned hereinabove, suitable materials include one or more of materials such as titanium nitride, aluminum, copper, silver, titanium, or noble metals such as gold, platinum and palladium. Suitable methods for depositing the upper plate material include, e.g., physical vapor deposition (PVD), chemical vapor deposition (CVD), and plasma enhanced chemical vapor deposition (PECVD). Upper plate 26 typically ranges in thickness, e.g., from approximately 300 Å to approximately 5000 Å. Similar to lower plate 22, upper plate 26 has a single or multi-layered configuration, or even has an arrangement whereby a first material (such as aluminum) is doped with a second material (such as copper or silicon). Also, in this particular embodiment of the invention, the planar formation of individual layers of capacitors 12 (including upper plate 26) is consistent with the overall goal of planarization with respect to the topography within the semiconductor body.

Upon completion of capacitor 12, a second metal layer 61 is formed on upper plates 26. The second metal layer is patterned together with upper plates 26, dielectric layers 24 and lower plate 22, as shown in FIG. 4c. The second metal layer is deposited in a suitable manner, such as by PVD, CVD or other suitable technique. Also, the patterned regions of the second metal layer (shown generally as M2) are formed in a suitable manner, e.g., using conventional photolithographic techniques. Patterned regions M2 are used, e.g., as the top electrodes of capacitors 12, and thus are used for electrical coupling to other components within DRAM 10.

Figure 4D:
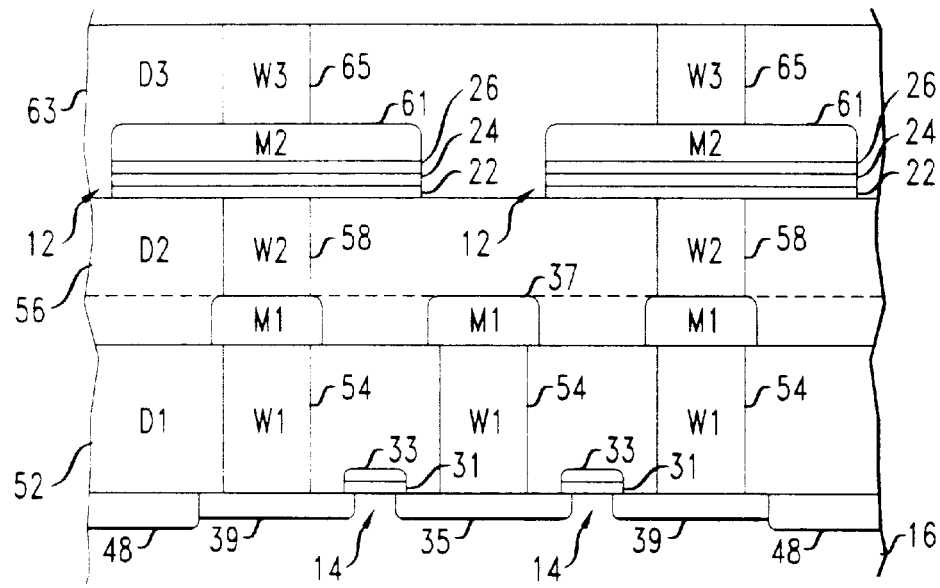

Upon completion of the formation of patterned regions M2, a third level oxide layer D3 is formed on patterned regions M2 and second oxide layer D2, as shown in FIG. 4d. Third oxide layer D3 is planarized (e.g., using CMP) and via windows W3 are selectively formed therein as shown. Such formation is similar to the formation of via windows W1 in first oxide layer D1 and windows W2 in second oxide layer D2, both discussed hereinabove. Windows W3 are filled with a conductive material (e.g., Ti, TiN, W, Al) and polished (e.g., using CMP) to form conductive plugs that are planar or nearly planar with third oxide layer D3, as shown in FIG. 4d.

Figure 4E:
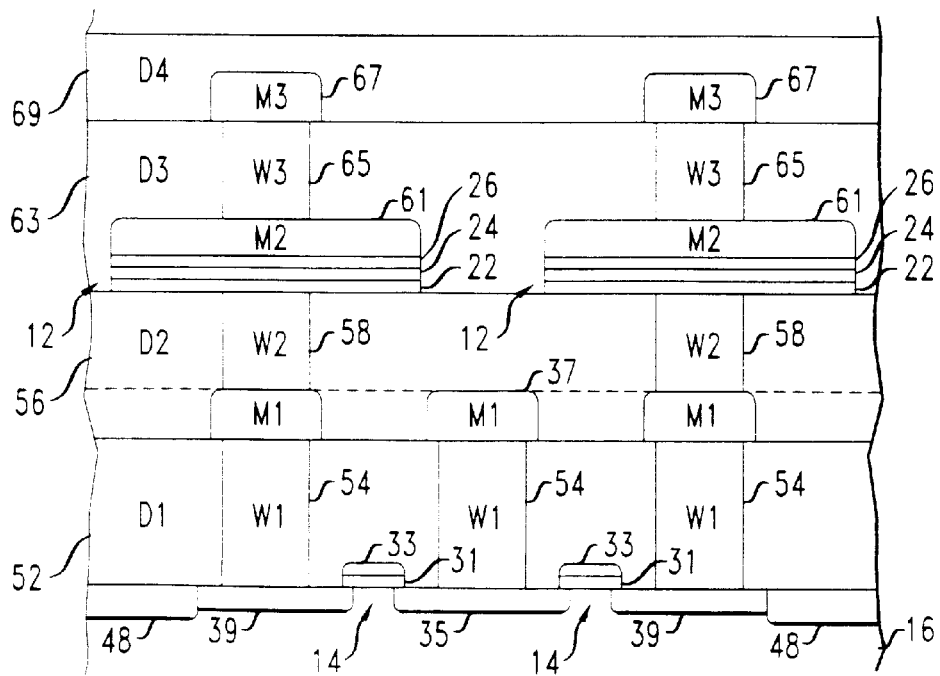

Referring now to FIG. 4e, DRAM 10 is shown after completion of the final stages of the fabrication method according to embodiments of the invention. Patterned metal regions M3 are formed in any suitable manner, e.g., in a manner similar to the formation of patterned metal regions M1 and M2, discussed hereinabove. Also, a fourth level oxide layer D4 is formed on patterned regions M3 and third oxide layer D3, e.g., as shown. Fourth oxide layer D4 is formed in any suitable manner, e.g., in the manner used to form first oxide layer D1, second oxide layer D2 and third oxide layer D3, as discussed hereinabove.

As discussed previously, fabrication methods according to embodiments of the invention and their resulting arrangements or configurations are conducive to modern planarization techniques, unlike conventional fabrication methods and arrangements. Planarization techniques seek to maintain or re-establish a consistent wafer topography. Also, planarization techniques work to offset a varied wafer topography. Planarization techniques include, e.g., chemical-mechanical polishing (CMP), multi-layer resist processing, the use of planarization layers, and reflow. Accordingly, planarization of the wafer is important for improvement of subsequent lithography processes, which results in greater accuracy of pattern imaging.

Embodiments of the invention are conducive to planarization techniques in many ways. For example, in the formation of oxide layers D1–D4, the deposited oxide layer is planarized prior to performing subsequent processing steps. That is, oxide layer D1 is planarized (e.g., using CMP) before depositing the first metal layer and subsequently patterning metal regions M1. It is the planarization of oxide layer D1 that enhances the patterning of subsequently formed metal regions M1. Similar advantages are enjoyed from the planarization efforts of other layers and elements according to embodiments of the invention.

Figure 5A:
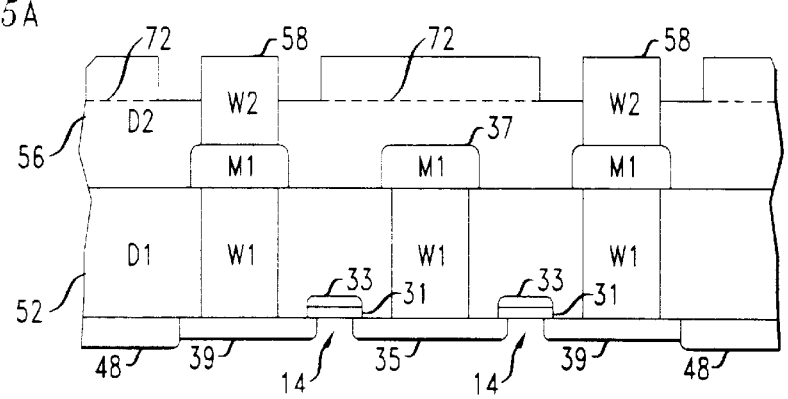
FIGS. 5a–b are cross-sectional views illustrating the fabrication of a MOM capacitor for a DRAM cell according to an alternative embodiment of the invention.
Figure 5B:
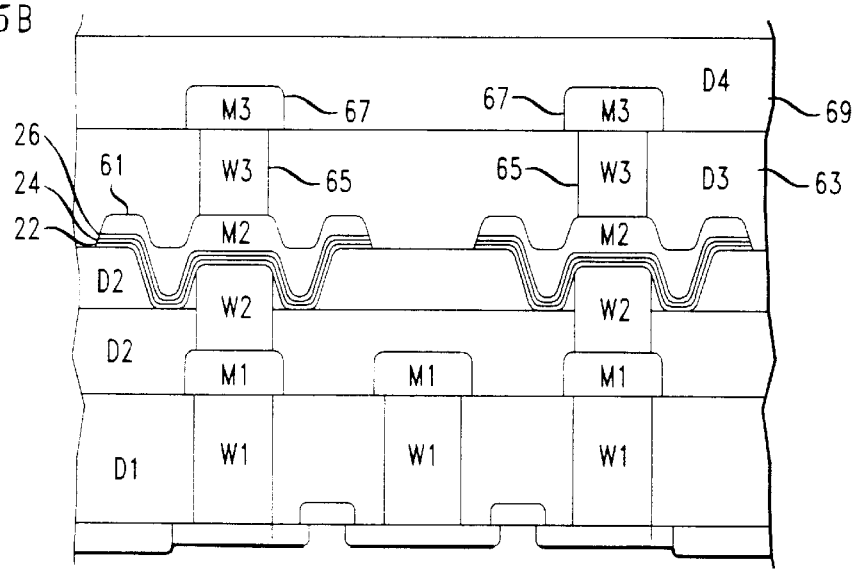

In an alternative embodiment of the invention, e.g., as shown in FIGS. 5a–b, a trench cell is fabricated using a few additional processing steps. The trench cell is fabricated by patterning a trench around the plug in window W2, as shown in FIG. 5a. The trench is patterned, e.g., by conventional etching or other suitable techniques. For example, a SiN etch stop (shown generally as 72) is formed within second oxide layer D2 during its formation. Accordingly, etch stop 72 determines the actual depth of the trench etch. Once the trench has been formed, capacitor 12 and the remaining layers (i.e., the M2 layer, oxide layer D3, the plug within window W3, the M3 layer and oxide layer D4) are formed according to embodiments of the invention, e.g., in the manner described above. The resulting arrangement is shown in FIG. 5b.

Figure 6:
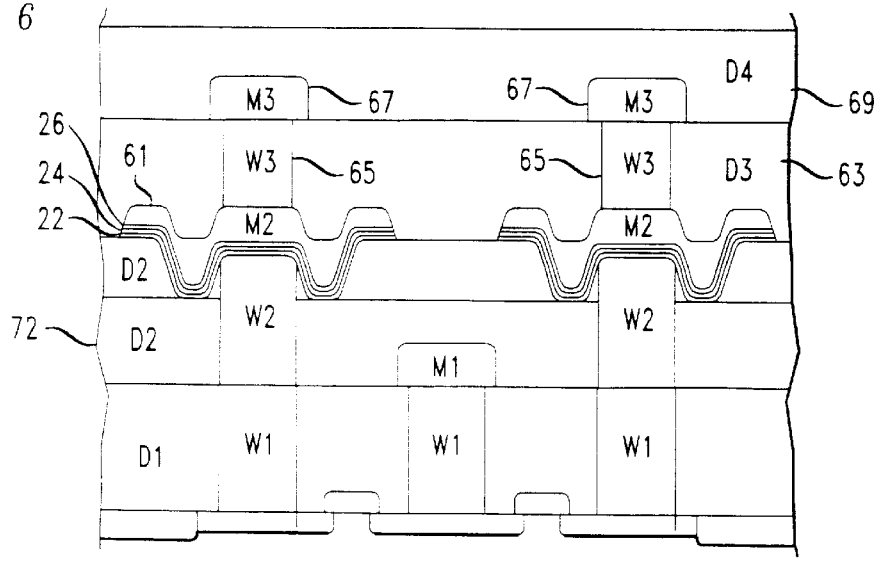
FIG. 6 is a cross-sectional view of a MOM capacitor for a DRAM cell according to another alternative embodiment of the invention.

Alternatively, the patterned M1 regions between the conductive plugs formed in windows W1 and W2 are omitted during fabrication, as shown in FIG. 6. Arrangements of this type are in response to any concerns that the trench portions of capacitors are too close to the patterned M1 regions between the plugs in windows W1 and W2.

One advantage that the embodiments shown in FIGS. 5–6 offer over conventional trench cell DRAMs is capacitance control. Capacitance control is determined by many factors, including the surface area of the capacitors themselves. The planarity or near planarity of the capacitors according to embodiments of the invention allows the dimensions of the capacitor surface area to be varied without offending other parameters such as space requirements within the DRAM.

Figure 7A:
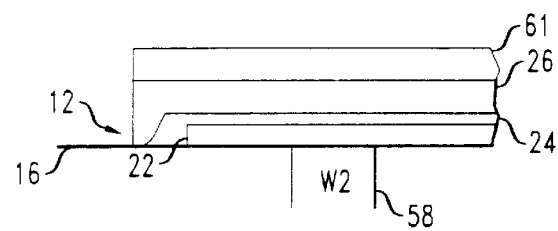
FIG. 7 is a cross-sectional view of a MOM capacitor for a DRAM cell according to yet another alternative embodiment of the invention.
Figure 7B:
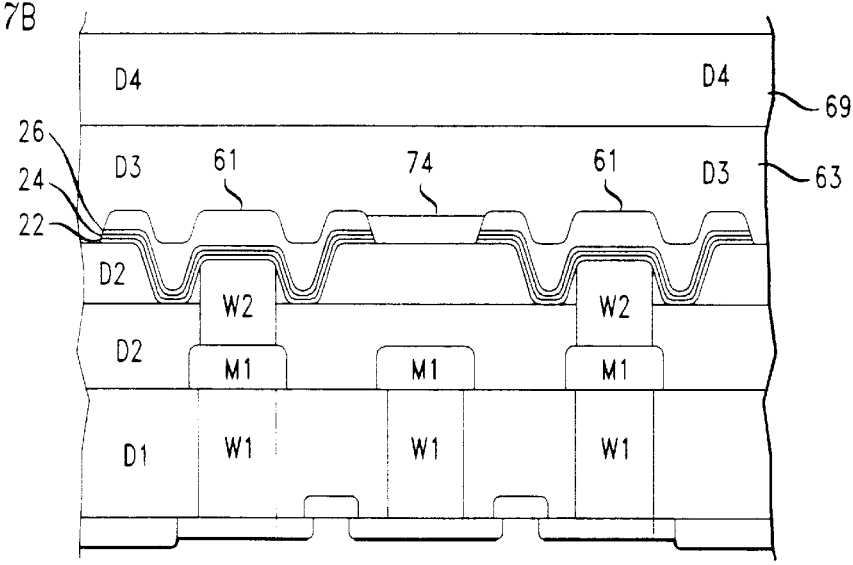

Referring now to FIGS. 7a–b, an alternative embodiment of the invention is shown for DRAMs and other devices employing 2 level metal technology, i.e., when M1 and M2 regions are formed but no M3 regions are formed. As shown in FIG. 7a, once lower plate 22 is formed and patterned, dielectric layer 24, when deposited on lower plate 22, often results in dielectric layer 24 forming around the patterned end of lower plate 22. Thereafter, upper plate 26 is deposited and patterned, resulting in the configuration shown.

Furthermore, as shown in FIG. 7b, the M2 region is not necessarily patterned in the area between the capacitor areas, e.g., the area shown generally as 74. Because no additional patterning techniques are needed in this embodiment, the unpatterned region 74 is made from the same material and during the same deposition step as is used in depositing the M2 regions 61.

Figure 8:
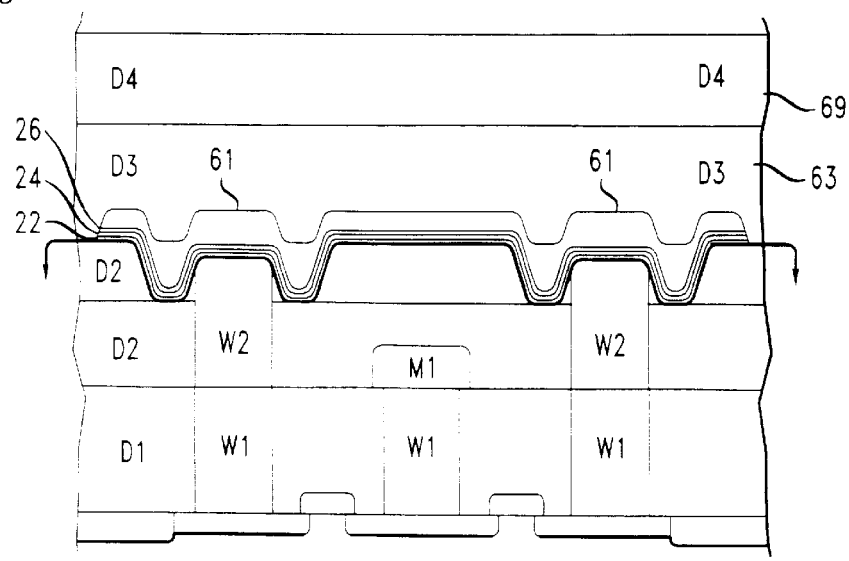
FIG. 8 is a cross-sectional view of a MOM capacitor for a DRAM cell according to still another alternative embodiment of the invention.

Also, in an alternative embodiment, e.g., as shown in FIG. 8, the conductive plug within window W2 is etched slightly after its initial formation to allow sufficient room to polish lower plate 22. As discussed previously herein, lower plate 22 is deposited on the conductive plug within window W2 and oxide layer D2 and then dielectric layer 24 is deposited on lower plate 22.

It will be apparent to those skilled in the art that many changes and substitutions can be made to the embodiments of the DRAM cells herein described without departing from the spirit and scope of the invention as defined by the appended claims and their full scope of equivalents.

What is claimed is:

1. A dynamic random access memory device, comprising:
   a substrate having at least one transistor formed thereon;
   at least one planarized oxide layer formed on said substrate and said transistor, said planarized oxide layer having an upper surface;
   at least one patterned metal region M1 formed within said planarized oxide layer; and
   at least one capacitor formed within said planarized oxide layer wherein said capacitor is formed between said patterned metal region M1 and said upper surface, wherein said capacitor includes a planarized lower plate, a planarized dielectric and a planarized upper plate.

2. The device as recited in claim 1, wherein said capacitor includes:
   said planarized dielectric formed on said planarized lower plate; and
   said planarized upper plate formed on said planarized dielectric.

3. The device as recited in claim 1, wherein said transistor has a gate and wherein said dynamic random access memory device further comprises a word line formed within said planarized oxide layer and coupled to said gate.

4. The device as recited in claim 1, wherein said transistor has a source and wherein said patterned metal region M1 includes a bit line coupled to said source.

5. The device as recited in claim 1, further comprising at least one patterned metal region M2 formed within said planarized oxide layer between said patterned metal region M1 and said upper surface, and wherein said at least one capacitor is embedded within said planarized oxide layer between said patterned metal region M1 and said patterned metal region M2.

6. The device as recited in claim 1, wherein said at least one planarized oxide layer further comprises a first planarized oxide layer D1 formed on said substrate, a second planarized oxide layer D2 formed on said first planarized oxide layer, a third planarized oxide layer D3 formed on said second planarized oxide layer and a fourth planarized oxide layer D4 formed on said third planarized oxide layer, wherein said patterned metal region M1 is formed between said first planarized oxide layer D1 and said second planarized oxide layer D2, and wherein said capacitor is formed between said second planarized oxide layer D2 and said third planarized oxide layer D3.

7. The device as recited in claim 1, further comprising at least one plug formed through said second planarized oxide layer D2 between said patterned metal region M1 and said capacitor.

8. A dynamic random access memory device, comprising:

a substrate having at least one transistor formed thereon;

at least one planarized oxide layer formed on said substrate and said transistor, said planarized oxide layer having an upper surface;

at least one patterned metal region M1 formed within said planarized oxide layer; and at least one capacitor formed within said planarized oxide layer wherein said capacitor is formed between said patterned metal region M1 and said upper surface, wherein said at least one planarized oxide layer further comprises a first planarized oxide layer D1 formed on said substrate, a second planarized oxide layer D2 formed on said first planarized oxide layer, a third planarized oxide layer D3 formed on said second planarized oxide layer and a fourth planarized oxide layer D4 formed on said third planarized oxide layer, wherein said patterned metal region M1 is formed between said first planarized oxide layer D1 and said second planarized oxide layer D2, and wherein said capacitor is formed between said second planarized oxide layer D2 and said third planarized oxide layer D3.

9. The device as recited in claim 8, wherein said capacitor includes:

a lower plate formed within said oxide layer between said patterned metal region M1 and said upper surface of said oxide layer;

a dielectric layer formed on said lower plate; and an upper plate formed on said dielectric layer.

10. The device as recited in claim 8, wherein said transistor has a gate and wherein said dynamic random access memory device further comprises a word line formed within said planarized oxide layer and coupled to said gate.

11. The device as recited in claim 8, wherein said transistor has a source and wherein said patterned metal region M1 includes a bit line coupled to said source.

12. The device as recited in claim 8, further comprising at least one patterned metal region M2 formed within said planarized oxide layer between said patterned metal region M1 and said upper surface, and wherein said at least one capacitor is embedded within said oxide layer between said patterned metal region M1 and said patterned metal region M2.

13. The device as recited in claim 8, wherein said capacitor further comprises a trench capacitor having at least one first capacitor portion formed within said second planarized oxide layer D2 and at least one second capacitor portion formed between said second planarized oxide layer D2 and said third planarized oxide layer D3.

14. The device as recited in claim 8, further comprising at least one plug formed through said second planarized oxide layer D2 between said patterned metal region M1 and said capacitor.

* * * * *